United States Patent [19]

Dwarakanath

[11] Patent Number: 4,495,472

[45] Date of Patent: Jan. 22, 1985

[54] STABLE FAST-SETTLING VOLTAGE REFERENCE BUFFER AMPLIFIER

[75] Inventor: Mirmira R. Dwarakanath, Berkeley Heights, N.J.

[73] Assignee: AT&T Bell Laboratories, Murray Hill, N.J.

[21] Appl. No.: 443,194

[22] Filed: Nov. 22, 1982

[51] Int. Cl.³ ............................................. H03F 3/16
[52] U.S. Cl. .................................... 330/277; 323/273; 323/280; 323/313; 330/293; 307/359
[58] Field of Search ................. 330/85, 260, 277, 288, 330/293, 253; 307/297, 359; 323/265, 273, 280, 313, 314, 315, 316

[56] References Cited

U.S. PATENT DOCUMENTS 3,984,780 10/1976 Hsiao et al. ...................... 330/260 X
4,365,209 12/1982 Yamauchi ........................ 330/288 X Primary Examiner—James B. Mullins
Attorney, Agent, or Firm—Lucian C. Canepa

[57] ABSTRACT

In a feedback-type buffer amplifier designed to be interposed between a reference voltage source and a capacitive load, the output of the amplifier is applied to each of two precisely matched or scaled source follower circuits. The voltages appearing at respective output nodes of the source follower circuits are designed to be identical to each other. But, significantly, the nodes are decoupled from each other. One output node is included in the feedback path of the buffer amplifier, whereas the other node constitutes the output terminal of the composite arrangement. Perturbations or phase shifts due to the load are thus effectively decoupled from the feedback path of the amplifier. A fast-settling stable overall configuration is thereby provided.

5 Claims, 2 Drawing Figures

STABLE FAST-SETTLING VOLTAGE REFERENCE BUFFER AMPLIFIER

BACKGROUND OF THE INVENTION

This invention relates to amplifiers and, more particularly, to a buffer amplifier designed to be interposed between a reference voltage source and a load.

In a variety of systems of practical importance, a highly precise reference voltage source is required. In one such system, capacitors included in a binary-weighted array in a pulse-code-modulation encoder or in a linear analog-to-digital converted (A/DC) are successively switched between ground and a reference voltage. In successive-approximation A/DCs, this switching action is designed to occur many times during a single conversion cycle.

For impedance conversion purposes, as well as to provide an instrumentality by means of which the output of a reference voltage source can be trimmed to achieve a precisely specified value needed for a particular application, it is customary to interpose a standard feedback-type buffer amplifier between the source and a load to be supplied therefrom. But the connection and disconnection of capacitors to the output of such an amplifier in an A/DC inevitably causes perturbations which are fed back to the input of the amplifier. In turn, this typically causes the output of the amplifier to deviate from the aforementioned precisely specified value. In practice, the output of the amplifier must be allowed to settle to the specified value before the output of the local digital-to-analog converter included in the A/DC can be tested. As a result, the conversion speed of the A/DC is thereby deleteriously affected.

In other systems, a standard buffered reference voltage source of the type described above is utilized to drive a relatively large capacitive load which is not switched. In such an arrangement, additional phase shift due to the load capacitance and the amplifier output impedance is introduced into the feedback loop. In turn, this can cause the buffered source configuration to become unstable.

Accordingly, workers in the art have directed considerable effort at trying to improve the manner in which a reference voltage source is buffered from a load to be supplied by the source. It was recognized that such effort, if successful, had the potential for significantly improving the operating characteristics of a variety of practical systems of commercial importance.

SUMMARY OF THE INVENTION

Hence, an object of the present invention is an improved amplifier designed to be connected as a buffer between a reference voltage source and a load. More specifically, an object of this invention is a feedback-type buffer amplifier characterized by a relatively short settling time and high stability.

Briefly, these and other objects of the present invention are realized in a specific illustrative embodiment thereof in which a feedback-type buffer amplifier is interposed between a reference voltage source and a load. The output of the amplifier is applied to each of two precisely matched or scaled source follower circuits. The voltages appearing at respective output nodes of the source follower circuits are designed to be identical to each other. But, significantly, the output nodes are decoupled from each other. One output node is included in the feedback path of the buffer amplifier, whereas the other node constitutes the output terminal of the composite arrangement. In turn, a capacitive load to be supplied with a predetermined reference voltage is connected to the output terminal. In this arrangement, perturbations or phase shifts due to the load are effectively decoupled from the feedback path of the amplifier. A fast-settling stable overall configuration is thereby realized.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
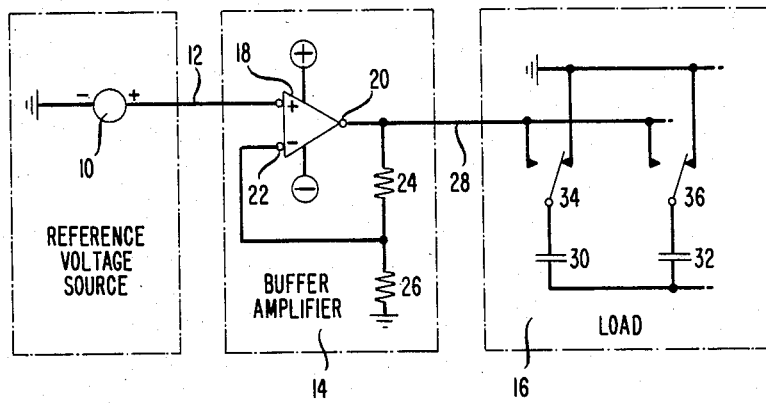
FIG. 1 is a schematic depiction of a conventional buffered reference voltage source.

The known arrangement shown in FIG. 1 includes a conventional high-impedance reference voltage source 10 that supplies a highly stable voltage that is substantially temperature-independent. Various standard such sources are known in the art. For illustrative purposes, it will be assumed herein that the direct-current voltage applied to output line 12 by the source 10 is +2.0 volts.

It is common practice to interpose a buffer 14 between the high-impedance source 10 and a load 16. A typical such buffer, comprising a standard operational amplifier 18 having a feedback path interconnecting output terminal 20 and input terminal 22, is shown in FIG. 1. By selecting appropriate values for resistors 24 and 26, the feedback factor of the buffer is adjusted to provide a highly stable prespecified voltage on output line 28. In that way, the value of the output voltage may be selected to be the same as, or higher than, the value of the voltage provided by the source 10. Advantageously, the output impedance of the buffer amplifier 14 is low relative to that of the output impedance of the reference source 10.

The particular voltage source 10 depicted in FIG. 1 (and also in FIG. 2) constitutes a unit that is separate and distinct from its associated operational amplifier. But, it is of course well known that the source 10 could alternatively be, for example, a so-called threshold-differencing reference and thus be included in the operational amplifier as an integral part thereof.

By way of example, the particular illustrative load 16 represented in FIG. 1 comprises part of a standard binary-weighted capacitor array included in an A/DC. As is well known, capacitors in the array are intended to be switched between ground and a reference voltage during the conversion process. Capacitors 30 and 32 and switches 34 and 36 in FIG. 1 schematically depict components included in such an array.

Whenever the upper plate of one of the capacitors in the load 16 of FIG. 1 is switched from ground to the line 28 emanating from the buffer amplifier 14, the voltage of the output node 20 of the operational amplifier 18 is altered. In turn, this voltage change is fed back to the input terminal 22 of the amplifier 18. As a result, the amplifier is perturbed and must be allowed time to resettle. Until the amplifier resettles, the prespecified reference voltage is not available at the output terminal 20.

Accordingly, the testing of a bit and the next switching of a load capacitor to the line 28 must await such resettling.

The time required for the buffer amplifier 14 (FIG. 1) to resettle is determined by the degree of resettling required and by the slew rate, the frequency response and the damping characteristics of the amplifier. For linear analog-to-digital converters, the degree of settling specified is typically one-quarter of the least significant bit (or approximately 0.025 percent of full scale for a 10-bit A/DC). For a typical metal-oxide-semiconductor (MOS) amplifier, the unity-gain-bandwidth (f) is approximately one megahertz. Hence, the settling time constant ($\frac{1}{2\pi f}$) for such an amplifier is approximately 150 nanoseconds. For 0.025 percent settling, eight time constants or about 1.2 microseconds must elapse before sufficient settling of the amplifier output has occured. And this time will of course be greater if the amplifier has gain or if the amplifier is not critically damped.

A relatively large capacitor connected between ground and the output line 28 (FIG. 1) would in theory tend to minimize output perturbations arising from the switching of capacitors in the load 16. But in practice the use of such a capacitor is generally avoided because it can introduce a sufficient phase shift via the noted feedback path to cause unstable operation of the amplifier.

Figure 2:
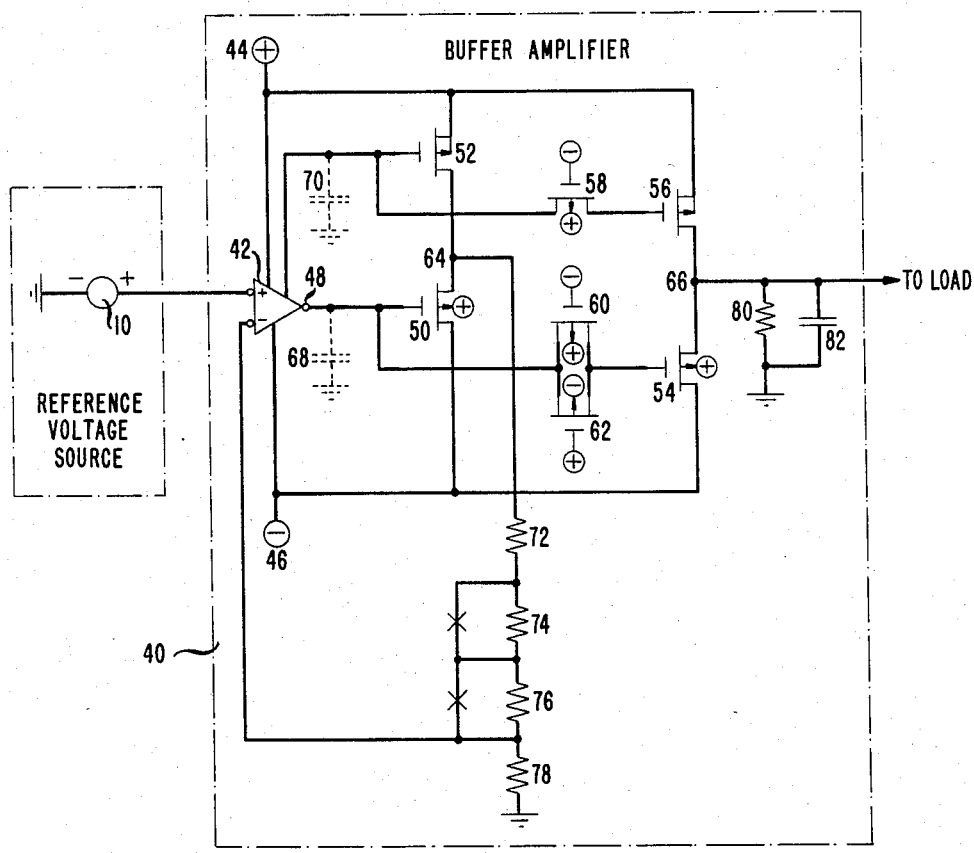
FIG. 2 shows a specific illustrative buffered reference voltage source made in accordance with the principles of the present invention.

FIG. 2 shows a specific illustrative circuit made in accordance with the principles of the present invention. By way of example, it will be assumed herein that the FIG. 2 arrangement is fabricated in integrated-circuit form in accordance with the complementary-metal-oxide-semiconductor (CMOS) technology.

A high-output-impedance reference voltage source 10, which may be identical to the source 10 shown in FIG. 1, is included in FIG. 2. The output of the source 10 is applied to a unique buffer amplifier 40 which is intended to be connected to a load of, for example, the type represented in FIG. 1. Alternatively, the load to be driven by the amplifier 40 may comprise a nonswitched capacitive element.

Illustratively, the buffer amplifier 40 of FIG. 2 includes a standard operational amplifier 42 that includes a feedback path. The output of the source 10 is applied to the upper or positive terminal of the amplifier 42, whereas the feedback path is connected to the lower or negative terminal thereof. By controlling the amount of feedback in the depicted arrangement, the gain of the amplifier 42 can be precisely controlled, as is well known in the art. In that way, the output voltage of the amplifier 42 can be adjusted to attain a specified value that is the same as, or greater than, the value of the output voltage provided by the source 10.

Two direct-current power supplies 44 and 46 are represented in FIG. 2. These supplies, whose values are, for example, +5 and −5 volts, respectively, provide power for the unit 42 and, as indicated, for various other elements included in the buffer amplifier 40.

The voltage provided by the operational amplifier 42 (FIG. 2) at output terminal 48 is applied to the input of each of two matched or precisely scaled configurations. Illustratively, these configurations each comprise a source follower circuit. The first or left-hand source follower circuit comprises two interconnected p-type MOS transistors 50 and 52, whereas the second or right-hand source follower circuit comprises two interconnected p-type MOS transistors 54 and 56. Each of the transistors 52 and 56 functions to supply a constant precisely predetermined value of bias current to the other transistor respectively connected thereto. Thus, the transistor 52 serves in effect as a current source for the transistor 50, whereas the transistor 56 serves as a current source for the transistor 54. Partially for this reason, the gate-to-source voltage of each of the transistors 50 and 54 can be maintained constant at a precisely specified value, as will become apparent from the further details specified below.

By way of example, a fixed gate voltage for each of the transistors 52 and 56 of FIG. 2 is derived from the internal circuitry of the operational amplifier 42. By appropriately scaling the sizes of the transistors 52 and 56, such a gate voltage is effective to cause the transistor 52 to supply a constant current of x microamperes to the transistor 50 and to cause the transistor 56 to supply a constant current of N.x microamperes to the transistor 54. In practice, N is a positive number usually greater than one. In that way, the power consumption properties of the overall configuration are minimized while at the same time the capability of the right-hand source follower to drive a load is enhanced.

A p-type MOS transistor 58 is connected as shown in FIG. 2 between the gates of the transistors 52 and 56. The transistor 58 serves as a relatively large-valued resistor (illustratively, approximately one megohm). Additionally, a p-type MOS transistor 60 and an n-type MOS transistor 62 are connected as shown between the gates of the transistors 50 and 54. In combination, the transistors 60 and 62 serve as a linear relatively large-valued resistor (also, for example, approximately one megohm). The exact purpose of these resistors will be specified later below.

The inherent threshold voltages of the transistors 50 and 54 are the same to a high accuracy (illustratively, to within 1-to-2 millivolts of each other). Moreover, as specified earlier above, the constant current supplied to the transistor 54 is controlled to be N times that to the transistor 50. Further, by physically scaling the transistors 50 and 54, the $\beta$ of the transistor 54 is made N times the $\beta$ of the transistor 50. In accordance with a feature of the present invention, the gate-to-source voltages of the transistors 50 and 54 are thereby made the same.

The voltage appearing at the output terminal 48 of the operational amplifier 42 of FIG. 2 is applied directly to the gate of the transistor 50. This same voltage is also applied, via the resistor represented by the transistors 60 and 62, to the gate of the transistor 54. And, since in accordance with the principles of the present invention, the gate-to-source voltages of the transistors 50 and 54 are designed to be identical, the voltages appearing at the upper or source electrodes of these transistors will be the same. In other words, the voltages appearing at node points 64 and 66 will consistently be the same.

The node points 64 and 66 constitute in effect dual output terminals of the buffer amplifier 40, Only the node point 64, however, is directly included in the feedback path of the operational amplifier 42. The other node point 66 serves as the output terminal to be connected to a load. And, significantly, the points 64 and 66 are strongly decoupled from each other. Hence, perturbations and phase shifts "seen" by the node point 66 do not appear to any substantial extent at the node point 64. Accordingly, the feedback-type operational amplifier 42 remains largely unaffected by such influences. In practice, the settling time and stability of the amplifier 40 are thereby significantly enhanced over known amplifiers of the type shown in FIG. 1.

Perturbations appearing at the node point 66 of FIG. 2 are coupled to the gates of the transistors 54 and 56 via the respective source-to-gate and drain-to-gate paths thereof. But perturbations at the gate of the transistor 54 are effectively prevented from reaching the operational amplifier 42 by the combined action of the resistor comprising the transistors 60 and 62 and parasitic capacitor 68. These elements constitute in effect a filter that diverts to ground all or a substantial part of the specified perturbations. Thus, little if any of these perturbations are directly coupled into the amplifier 42 via the terminal 48 or coupled into the feedback path thereof via the transistors 50.

Similarly, the resistor consisting of the transistor 58 and parasitic capacitor 70 also serve as an effective filter. This filter prevents all or a substantial part of the perturbations at the gate of the transistor 56 from reaching the internal circuitry of the operational amplifier 42 or from affecting the value of the current supplied to the transistor 50 by the transistor 52.

In practice, the precise voltage supplied by a particular high-precision reference source such as the source 10 in FIG. 2 may not be exactly the value needed for a specific load to be driven by the buffer amplifier 40. In such a case, the output voltage appearing at each of the node points 64 and 66 can be adjusted or trimmed relative to the output of the source 10. This can easily be done, for example, by providing a number of conventional resistors 72, 74, 76 and 78 in the feedback path of the operational amplifier 42. Conductive links connected in parallel with selected ones of these resistors can be opened by conventional trimming techniques, thereby varying the feedback factor and hence the overall gain of the depicted arrangement. The voltage appearing at output terminal 48 of the amplifier 42 is thereby adjusted to be the desired output voltage minus the gate-to-source voltage of the transistors 50 and 54. In that way, the voltage appearing at each of the node points 64 and 66 is the desired output voltage.

Some of the current supplied by the transistor 52 of FIG. 2 toward the transistor 50 is diverted to ground via the aforementioned feedback resistors. Accordingly, to establish accurate matching or scaling of the two depicted source followers, it is advantageous to include in the amplifier 40 a resistor 80 connected between the node point 66 and ground. Advantageously, the value of the resistor 80 should be 1/N that of the total resistance actually connected between the node point 64 and ground.

Accurate scaling of the two source follower circuits (FIG. 2) in the particular manner specified above is advantageous. One result of such scaling is that the output voltage appearing at the output node 66 is thereby made substantially temperature-independent.

As indicated above, strong decoupling exists between the node points 64 and 66 of FIG. 2. Accordingly, phase shifts arising from relatively large load capacitors connected to the point 66 are not coupled back to any substantial extent into the operational amplifier 42. For this reason, it is feasible in some particular applications to connect a decoupling capacitor 82 between the point 66 and ground. Such a capacitor serves to reduce output perturbations due to connecting and disconnecting load capacitors, thereby increasing the speed of operation of the A/DC.

In FIG. 2, connecting and disconnecting loads cause the voltage of the node point 66 to be altered. The settling time of the point 66 is proportional to the output impedance of the source follower comprising the transistors 54 and 56. In turn, this output impedance is inversely proportional to the current supplied by the transistor 56 and to the $\beta$ of the transistor 54. In practice, these parameters can conveniently be selected to achieve an output-terminal settling time that is about an order of magnitude less than that of the standard arrangement shown in FIG. 1.

Finally, it is to be understood that the above-described arrangements are only illustrative of the application of the principles of the present invention. In accordance with these principles, numerous alternatives may be devised by those skilled in the art without departing from the spirit and scope of the invention.

What is claimed is:

1. A stable fast-settling buffer configuration comprising
  an amplifier having input and output terminals,
  first and second stages decoupled from each other and responsive to a voltage appearing at said output terminal for providing identical output voltages at first and second node points, respectively, said second node point being adapted to be connected to a load,
  and a feedback path connected between said first node point and the input terminal of said amplifier,
  wherein said amplifier includes an additional input terminal and wherein a reference voltage source is connected to said additional input terminal,
  wherein a capacitive load is connected to said second node point,
  wherein said first and second stages comprise first and second source follower circuits, respectively,
  wherein each of said first and second source follower circuits comprises a current source in series with the source-to-drain path of an MOS transistor,
  wherein the output terminal of said amplifier is directly connected to the gate of the transistor in said first source follower circuit and is connected to the gate of the transistor in said second source follower circuit via a decoupling element,
  and wherein the current source in said second source follower circuit supplies a current that is N times that supplied by the current source in said first source follower circuit, where N is a positive number, and wherein the $\beta$ of the transistor in said second source follower circuit is N times that of the transistor in said first source follower circuit.

2. A buffer amplifier adapted to be interposed between a reference voltage source and a capacitive load, said buffer amplifier comprising
  a two-input-terminal operational amplifier having an output terminal, one input terminal being adapted to be connected to the output of a reference voltage source and the other input terminal being adapted to be connected to a feedback path,
  first and second scaled source follower circuits respectively including MOS transistors whose gate-to-source voltages are designed to be the same,
  means for applying the voltage appearing at the output terminal of said operational amplifier to the gates of said transistors, said means including a decoupling element connected between said output terminal and the gate of the transistor in said second circuit,
  and a feedback path connected between the source of the transistor in said first circuit and the other input terminal of said operational amplifier, whereby perturbations or phase shifts arising from a capacitive load connected to the source of the transistor in said second circuit are effectively decoupled from said operational amplifier thereby to provide a relatively stable and fast-settling buffer amplifier, wherein each of said source follower circuits includes a constant current source connected to the source of the transistor included in said circuit, and wherein the constant current source in said second circuit is adapted to supply a current N times that supplied by the constant current source in said first circuit, and wherein the $\beta$ of the transistor in said second circuit is designed to be N times that of the transistor in said first circuit.

3. An amplifier as in claim 2 wherein said feedback path includes an adjustable resistive network for controlling the value of the voltage available at the output terminal of said operational amplifier and thereby also the value of the voltage available at the source of the transistor in said second circuit.

4. An amplifier as in claim 3 further including a decoupling capacitor connected to the source of the transistor in said second circuit.

5. A stable fast-settling buffer configuration comprising an amplifier having input and output terminals, first and second stages decoupled from each other and responsive to a voltage appearing at said output terminal for providing identical output voltages at first and second node points, respectively, said second node point being adapted to be connected to a load, and a feedback path connected between said first node point and the input terminal of said amplifier, wherein said amplifier includes an additional input terminal to which a reference voltage source is adapted to be connected, wherein said first and second stages comprise first and second source follower circuits, respectively, wherein each of said first and second source follower circuits comprises a current source in series with the source-to-drain path of an MOS transistor, wherein the output terminal of said amplifier is directly connected to the gate of the transistor in said first source follower circuit and is connected to the gate of the transistor in said second source follower circuit via a decoupling element, and wherein the current source in said second source follower circuit supplies a current that is N times that supplied by the current source in said first source follower circuit, where N is a positive number, and wherein the $\beta$ of the transistor in said second source follower circuit is N times that of the transistor in said first source follower circuit.

* * * * *